United States Patent [19]

Rubner et al.

[11] Patent Number: 4,486,463

[45] Date of Patent: Dec. 4, 1984

[54] SELECTIVE METAL PLATING ONTO POLY(PHENYLENE SULFIDE) SUBSTRATES

[75] Inventors: Michael F. Rubner, Chelmsford; Peter Cukor, Natick, both of Mass.

[73] Assignee: GTE Laboratories, Incorporated, Waltham, Mass.

[21] Appl. No.: 563,950

[22] Filed: Dec. 21, 1983

[51] Int. Cl.$^3$ ............................................. C23C 3/02
[52] U.S. Cl. .................... 427/53.1; 204/15; 204/38 B; 427/98; 427/316; 427/304; 427/305; 427/306; 427/307; 427/404
[58] Field of Search .............. 427/53.1, 98, 304–307, 427/316, 404; 204/15, 38 B

[56] References Cited

U.S. PATENT DOCUMENTS

| | | | |
|---|---|---|---|
| 4,239,789 | 12/1980 | Blum | 427/53.1 |
| 4,440,801 | 4/1984 | Aviram | 427/98 |
| 4,447,471 | 5/1984 | Pott | 427/98 |

FOREIGN PATENT DOCUMENTS 0031444  7/1981  European Pat. Off.

OTHER PUBLICATIONS

Rubner, M., Cukor, P., Jopson, H., and Deits, Walter, "Electrically Conducting Poly(para-Phenylene Sulfide) Prepared by Doping with Nitrosyl Salts from Solution", *Journal of Electronic Materials*, vol. 11, No. 2, Mar. 1982.

Domino, F. A., "Plating of Plastics—Recent Developments", Chemical Technology Review No. 138, pp. 112–116, Noyes Data Corp., New Jersey, (1979).

U.S. Ser. No. 391,199 filed 6/23/82, Rubner et al.

Feldstein, "Selective Electroless Plating Techniques: A Survey", Plating, Aug. 1970.

*Primary Examiner*—John D. Smith
*Attorney, Agent, or Firm*—Hamilton, Brook, Smith & Reynolds

[57] ABSTRACT

A method for selectively plating metal, such as copper, onto poly(phenylene sulfide) substrates is disclosed. In this method, a crystalline region and an amorphous region are created in a substrate. One method for creating these regions is to selectively crystallize a region in an amorphous poly(phenylene sulfide) substrate by heating it above its glass transition temperature. The surface of the substrate is then activated with an electroless plating catalyst such as palladium metal. After activation, a nitrosyl salt is introduced into the amorphous region of the substrate. The substrate is then immersed in an electroless plating solution containing the metal ions whereby metal selectively plates onto the crystalline region of the substrate.

14 Claims, No Drawings

SELECTIVE METAL PLATING ONTO POLY(PHENYLENE SULFIDE) SUBSTRATES

TECHNICAL FIELD

This invention is in the field of polymer chemistry and more specifically relates to the selective plating of metals onto poly(phenylene sulfide) substrates.

BACKGROUND ART

The electronics industry has been expanding rapidly due to the advent of solid-state components and the fabrication techniques necessary to incorporate these components into electrical equipment. Because of the demand, there has been extensive research directed towards finding new techniques for producing some of these components, including printed circuit boards. This research has included attempts to employ polymers and metal coated polymers in the fabrication of printed circuit boards because such polymers offer potentially attractive advantages.

One of the techniques for depositing metal onto a polymer substrate is electroless plating. In a conventional electroless plating process, the polymer substrate is acid-etched and then activated for metal deposition, usually with a mixture of tin salts and noble metal salts applied jointly or consecutively. The activated substrate is then immersed in an electroless plating bath, typically containing metal ions and a reducing agent, and metal plates onto the substrate. Selective deposition of metal can be achieved by selective activation of the substrate. A survey of the patent and technique literature relating to electrolessly plating metal onto polymers is contained in Domino, F. A., "Plating of Plastics—Recent Developments," Chemical Technology Review No. 138, Noyes Data Corp., New Jersey (1979).

Although selective deposition of metal onto polymers has been accomplished by a number of techniques, previously employed techniques suffer from significant disadvantages. For example, photolithographic and etching techniques, which have been traditionally used to prepare conductive patterns from metal-coated polymers, are relatively expensive, cumbersome and time-consuming operations. On the other hand, selective activation of polymer substrates often employs stamps or stencils containing suitable redox reagents which reduce an activating metal ion on the surface of the substrate. Although such selective activation is possible, the resolution of the metal pattern is severely limited by the physical dimensions of the stamp or stencil employed.

DISCLOSURE OF THE INVENTION

This invention provides a unique and novel process for selectively plating metal onto a poly(phenylene sulfide) substrate. The method is based upon the discovery that an electroless plating catalyst can be selectively deactivated in amorphous regions of the substrate by exposing the substrate to certain nitrosyl salts.

In one embodiment, a crystalline region and an amorphous region are created on a poly(phenylene sulfide) substrate. One method for doing this conveniently involves selective crystallization of an amorphous poly(phenylene sulfide) substrate. The surface of the substrate is then activated with an electroless plating catalyst, after which a nitrosyl salt is selectively introduced into the amorphous region of the substrate thereby inhibiting catalyst in the amorphous region. The substrate is then contacted with an electroless plating solution containing metal ions whereby metal is selectively plated onto the crystalline region of the substrate.

This method has significant advantages over those methods previously employed for the selective plating of metal onto polymer substrates. For example, it takes advantage of the selective doping of poly(phenylene sulfide) substrates which can be achieved based on differences in the degree of crystallinity therein. It thus makes it possible to employ poly(phenylene sulfide) in the fabrication of printed circuit boards and other devices requiring selective metal coatings thereon. Poly(phenylene sulfide) is a particularly attractive polymer for such applications because of its outstanding properties. In addition, poly(phenylene sulfide) is a thermoplastic material which can be formed by conventional polymer processing techniques.

The method also eliminates the costly and cumbersome photolithographic and etching techniques often required in previous processes directed to selectively plating metals onto polymers. Additionally, because the method is an additive process, it minimizes the use of the relatively expensive metal.

A still further advantage of this method is the fact that conventional and standard electroless plating solutions can be employed to form the selective metal coatings on the poly(phenylene sulfide) substrate. In many cases, these solutions are aqueous solutions thereby eliminating any need for organic solvents.

BEST MODE FOR CARRYING OUT THE INVENTION

Poly(phenylene sulfide) is an aromatic polymer in which para-substituted benzene rings are joined together by sulfur atoms. The polymer is illustrated by the following structural formula:

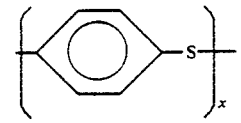

where x is the number of repeating units in the polymer chain. The combination of an aromatic ring and a sulfur atom adds stability, and as a result, poly(phenylene sulfide) exhibits outstanding high temperature stability, inherent flame resistance and good chemical resistance. Poly(phenylene sulfide) also has outstanding mechanical properties, such as a high tensile strength and a high flexural modulus.

Poly(phenylene sulfide) is intrinsically an insulating material. It can be converted to an electrically conductive polymer, however, by exposure to certain oxidizing or reducing agents. For example, alkali metals such as lithium, sodium, potassium, rubidium and cesium can serve as suitable electron donors (n-type dopants) and Lewis acids, such as arsenic pentafluoride, can serve as suitable electron acceptors (p-type dopants). Doping poly(phenylene sulfide) to convert it to an electrically conductive polymer is known in the art. See, for example, European Patent Application No. 80107178.2, filed Nov. 19, 1980, and published on July 8, 1981 under Publication No. 0 031 444, the teachings of which are hereby incorporated by reference.

The amount of doping agent needed to render poly(phenylene sulfide) conductive is typically much greater than the low impurity levels used to dope traditional semiconductors. In fact, up to 40 mole percent of an oxidizing agent is commonly used to dope poly(phenylene sulfide).

Amorphous films of poly(phenylene sulfide) can be readily obtained by casting films of the polymer from solution or by conventional blow molding techniques. These amorphous poly(phenylene sulfide) films exhibit three thermal events characteristic of most thermoplastic materials when they are subjected to differential scanning calorimetry. The first event occurs at about 95° C., which is the glass transition temperature ($T_g$) of this polymer. At this temperature, the polymer chains in the amorphous domains have sufficient energy to overcome the restraints of secondary bonds and are therefore free to move in a liquid-like manner. This is frequently referred to as the onset of molecular motion.

The second thermal event occurs at temperatures of about 150° C., which is the crystallization temperature ($T_c$) of poly(phenylene sulfide). At this temperature, the polymer chains can reorganize into a more ordered structure.

The third major thermal event is the crystalline melt temperature ($T_m$), which occurs at about 270° C. for poly(phenylene sulfide).

Differential scanning calorimetry indicates that amorphous poly(phenylene sulfide) films rapidly crystallize when they are heated to a temperature above the glass transition temperature ($T_g$) but below the crystalline melt temperature ($T_m$). Crystallization is a direct consequence of the compact, symmetrical structure of poly(phenylene sulfide) which promotes a high degree of crystallinity.

Optimum annealing temperatures are below the crystallization temperature ($T_c$) of about 150° and above the glass transition temperature ($T_g$) of about 95° C.

Heat can be applied to an amorphous substrate in a selective pattern to achieve selective crystallization by a number of different techniques. For example, a standard laboratory heat gun can be employed as a heat source and hot air from the gun can be directed through a mask having the desired pattern cut therein. This method results in convective heating of the substrate. Alternatively, a radiant heat source can be used to direct radiant energy through a mask to the substrate. Still another alternative is to employ laser light, such as focused laser light from a continuous wave CO₂ laser to create the selective crystallization pattern desired. A more detailed description of techniques for selectively crystallizing one or more regions of amorphous poly(phenylene sulfide) films is given in copending application Ser. No. 391,199, filed June 23, 1982, the teachings of which are hereby incorporated by reference.

It is recognized that the term "crystalline" is applied to polymers having varying degrees of crystallinity. For purposes of this invention, a region of poly(phenylene sulfide) is considered "crystalline" if that region does not dope to an extent sufficient to cause significant inhibition of the electroless plating catalyst.

After a selective pattern of crystallization has been established in the poly(phenylene sulfide) substrate, it is preferable to acid-etch the surface of the substrate. The purpose of this step is to convert the hydrophobic surface of the polymer substrate to a hydrophillic surface. This enables a strong bond to be formed between the metal subsequently electrolessly selectively deposited and the substrate. Although the acid-etching can be done at other stages of the process described herein, it is particularly preferred to acid-etch the substrate prior to depositing the electroless plating catalyst to obtain the strongest possible bonding of metal to the substrate in the subsequent electroless deposition of metal. Suitable acid-etchant solutions include chromic acid solutions, such as a solution comprising $Na_2Cr_2O_7.2H_2O$ dissolved in concentrated sulfuric acid.

The substrate is activated for electroless metal deposition with an electroless plating catalyst. Typically, this is done by immersing the substrate in an aqueous solution containing noble metal ions which are catalytic to the reduction of the metal to be selectively deposited and a reducing agent. A specific example of a suitable activating solution comprises $PdCl_2$ and $SnCl_2$ dissolved in a dilute hydrochloric acid solution. Other known electroless plating catalysts include platinum, iridium, rhodium and osmium.

After the polymer substrate has been activated with an electroless plating catalyst, it is selectively doped with an oxidizing agent or dopant in its amorphous region to inactivate the catalyst in that region. Suitable oxidizing agents comprise nitrosyl salts having anions of the type $(MX_n)^-$, wherein M represents an element in Group 5a of the periodic table of elements, X represents a halogen atom, and n is an integer sufficient to provide the anion with a valance of minus one. Suitable nitrosyl salts include $NOPF_6$, $NOAsF_6$, and $NOSbF_6$. Solutions of these nitrosyl salts provide rapid and facile doping of the amorphous region of poly(phenylene sulfide) substrates without significant doping of the crystalline region.

The nitrosyl salts dissolve readily in the solvent methylene chloride, but it has been found that poly(phenylene sulfide) tends to crystallize upon exposure to this solvent. On the other hand, nitromethane does not spontaneously solvent crystallize poly(phenylene sulfide), but the desired nitrosyl salts have low solubility in this solvent. Therefore, a particularly preferred solvent system for the nitrosyl salts is a co-solvent system of nitromethane and methylene chloride, with the methylene chloride comprising a minor component of the co-solvent. For example, a solution of a nitrosyl salt in a co-solvent system containing 70% nitromethane and 30% methylene chloride has been found very satisfactory.

The poly(phenylene sulfide) substrate can be immersed in the solution of nitrosyl salt. The salt is rapidly taken up by the amorphous poly(phenylene sulfide) to produce doped, electrically conductive poly(phenylene sulfide) having conductivities ranging up to about one $ohm^{-1}cm^{-1}$. The time required for doping depends upon factors such as the precise salt, its concentration, temperature, etc. This time can range from a matter of seconds or minutes up to one or more hours.

When the poly(phenylene sulfide) is exposed to the solution of nitrosyl salt, the amorphous region of the polymer is oxidized by the $NO^+$ cation, which is in turn reduced to NO gas and released during doping. The anion remains in the polymer to maintain charge balance therein. The exact mechanism for the inhibition of the electroless plating catalyst is unknown. It is known, however, that such selective inhibiting of electroless plating catalyst in amorphous regions is not achieved if the poly(phenylene sulfide) substrate is selectively doped first and subsequently activated by immersion in a solution of electroless plating catalyst. Thus, the sequence of first activating the substrate and subsequently selectively doping the substrate in amorphous region is necessary in the process described herein.

The selectivity of doping which occurs with nitrosyl salts, depending upon the crystallinity of the poly(phenylene sulfide) substrate, is also described in co-pending application Ser. No. 391,199, cited and incorporated by reference above. Further, the relationship between such doping and the degree of crystallinity in the substrate is described in Rubner, M., Cukor, P., Jopson, H. and Deits, W., "Electrically Conducting Poly(para-phenylene sulfide) Prepared By Doping With Nitrosyl Salts From Solution", *J. Elec. Mat.*, 11, No. 2, March, 1982, the teachings of which are also hereby incorporated by reference.

After the amorphous portions of the poly(phenylene sulfide) substrate have been selectively oxidized to inhibit catalyst at the amorphous region, the substrate is contacted with an electroless plating solution containing metal. This results in the deposition of metal ions onto the crystalline region of the substrate but not onto the amorphous region. In essence, the crystalline region acts as a template for metal deposition. The amorphous region is simultaneously hydrolyzed thereby converting it to an electrically non-conducting region.

Traditional electroless plating solutions can be utilized to deposit metal onto the patterned substrates. Typically, such solutions contain metal ions, such as copper ions, nickel ions, antimony ions, aluminum ions, ferric ions, zinc ions, chromium ions, etc. In addition to the metal ions to be deposited, such solutions typically also include a reducing agent, such as formaldehyde, and a complexing agent, such as sodium potassium tartrate.

As described above, the electroless plating steps and solutions which can be employed with this invention include those traditionally used in well-known electroless plating techniques. Thus, suitable etchant solutions, activating solutions, and metal plating solutions include those which have been customarily employed. Detailed information on such solutions is contained in the Domino book, cited above, the teachings of which are incorporated by reference in regard to such solutions. In addition, those skilled in the art will know other suitable solutions, or will be able to ascertain them using no more than routine experimentation.

Once the initial metal pattern is deposited, its thickness can be increased by conventional electroplating techniques. For substrates containing selectively electrolessly deposited copper, it was found that good results could be obtained if the substrate was exposed to an inhibited electroless plating solution before electroplating in a standard sulfuric acid/ copper sulfate bath. The inhibited solution (an electroless plating solution containing a trace amount of NaCN) prevented plating of copper on activated surfaces but did not prevent plating on the thin copper pattern formed in the initial electroless plating bath. In other words, in the electroless plating bath, deposition of copper was initiated by catalytic palladium metal, whereas in the inhibited bath, deposition of copper was catalyzed by the thin film of copper deposited in the initial electroless plating solution. This technique provided strongly adherent copper patterns which were ideally suited for electroplating.

This invention will be further and more specifically described by the following examples.

EXAMPLE 1

Selective Crystallization with Convective Heating

A 2-mil thick amorphous poly(phenylene sulfide) sheet sold under the tradename Ryton by Phillips petroleum was employed. This amorphous polymer film was selectively annealed employing a standard laboratory heat gun as the heat source and a mask containing a pattern of alternately spaced 0.1 and 0.35 cm slits. The mask was constructed out of a glass-filled epoxy laminate. The mask was placed over the substrate and the heat gun was positioned about five inches above the mask. During the annealing step, which typically lasted about one minute, the heat gun was repositioned to maintain the film temperature at 120° C. The pattern created on the film by the annealing step was easily discernable due to the contrast between the opaque crystalline regions (exposed) and the transparent amorphous regions.

The patterned film was then etched for four minutes at 25° C. in a solution containing 0.2 g $Na_2Cr_2O_7.2H_2O$ dissolved in 100 ml of concentrated $H_2SO_4$ and then rinsed with water. The polymer film was sensitized for 10 minutes at 25° C. in a solution containing 0.020 g $PdCl_2$, 0.2 g $SnCl_2$ and 10 ml HCl dissolved in 100 ml of $H_2O$ and then rinsed with $H_2O$. The polymer film was thoroughly dried and immersed in a doping solution (for 10-20 minutes) containing 1.4 g $NOPF_6$ dissolved in a 100 ml solution of 70 percent nitromethane and 30 percent methylene chloride. This oxidized the amorphous regions of the film, causing the color of the film to change from transparent amber to black. It also inactivated palladium catalyst in amorphous regions. Crystalline regions of the film were not oxidized and catalyst there remained active.

The polymer film was then immersed for 10 minutes in a electroless plating bath (at 0° C.) containing 1.0 g $CuSO_4$, 1.0 g NaOH, 5.0 g sodium potassium tartrate and 1.0 ml of formaldehyde dissolved in 100 ml of $H_2O$. This produced an initial strike of copper to deposit only in the crystalline regions of the film. The thickness of the initial copper pattern selectively deposited was approximately 1.0 mil of copper. During plating, the amorphous regions of the substrate returned to their original light amber color, which is characteristic of electrically insulating poly(phenylene sulfide) films. The film was subsequently annealed to improve its thermal stability.

EXAMPLE 2

Selective Crystallization with Laser Irradiation

The procedure of Example 1 was employed except that selective crystallization was accomplished with laser irradiation. The film was exposed to a collimated beam from a 100 Mw C. W. $CO_2$ laser for periods ranging from 5 to 15 seconds. Using this technique in combination with an aluminum mask, 0.01 cm features were routinely resolved.

EXAMPLE 3

Varying Doping Times

The procedures and materials of Example 1 were employed except as follows. The substrate was immersed in the etchant and plating solutions for 5 minutes each. The time in which the substrate was immersed in the doping solution was varied and the following results were obtained:

| Doping Time (min.) | Results |
| --- | --- |
| 5 | No selective metal plating |
| 10 | Selective metal plating at crystalline regions |
| 20 | Selective metal plating at crystalline regions |
| 30 | Partial plating in crystalline regions; no plating in amorphous regions |
| 60 | No plating anywhere. |

EXAMPLE 4

Varying Sequence of Steps

The procedures and materials of Example 1 were employed, except that the sequence of steps was varied. The results were:

| | |
| --- | --- |
| Sequence A: | Etch, sensitize, dope, electroless plate |
| Results: | Excellent selectivity, plates only in crystalline regions. |
| Sequence B: | Dope, etch, sensitize, electroless plate |
| Results: | No selectivity; plates on both amorphous and crystalline regions. |
| Sequence C: | Etch, dope, sensitize, electroless plate |
| Results: | No selectivity; plates on both amorphous and crystalline regions. |

EXAMPLE 5

Effect of Etch Step

The procedures and materials of Example 1 were employed, except that the etch step was omitted in some cases, and the sequence was varied as described. Additionally, a standard peel test (Scotch tape) was employed. The results were:

| | |
| --- | --- |
| Sequence A: | Sensitize, dope, electroless plate |
| Results: | Poor adhesion of copper metal to PPS film (fails standard peel test). |
| Sequence B: | Etch, sensitize, dope, electroless plate |
| Results: | Excellent adhesion (passes standard peel test). |
| Sequence C: | Dope, etch, sensitize, electroless |
| Results: | Poor adhesion (fails peel test); poor selectivity. |

Industrial Applicability

The invention described herein relates to a method for selectively depositing metal onto poly(phenylene sulfide) substrates. Thus, the method can be applied to the fabrication of sensors, data processing materials, flexible circuits, decorative plaques, etc.

Equivalents

Those skilled in the art will recognize or be able to ascertain, using no more than routine experimentation, many equivalents to the specific embodiments of the invention described herein. As one example, it is believed that a crystalline poly(phenylene sulfide) substrate could be treated in a selective manner to form an amorphous region thereon, rather than selectively treating an amorphous substrate to produce a crystalline region thereon, as described herein.

Such equivalents are intended to be covered by the following claims.

We claim:

1. A method of selectively plating metal onto a poly(phenylene sulfide) substrate, comprising;
   a. creating a crystalline region and an amorphous region on said substrate;
   b. activating the surface of said substrate with an electroless plating catalyst for said metal;
   c. selectively introducing into the amorphous region of said substrate a dopant which inactivates the electroless plating catalyst; and
   d. contacting said substrate with an electroless plating solution containing metal ions to thereby selectively plate metal onto the crystalline region of said substrate.

2. A method of claim 1 wherein the crystalline and amorphous regions of said substrate are created by selectively crystallizing regions of an amorphous poly(phenylene sulfide) substrate.

3. A method of claim 2 wherein said dopant comprises a nitrosyl salt containing an anion having the formula $(MX_n)^-$, wherein M represents a Group 5a element, X represents a halogen atom, and n is an integer sufficient to provide the anion with a valence of minus one.

4. A method of claim 3 wherein the surface of said substrate is acid-etched prior to activating it with said electroless plating catalyst.

5. A method of claim 4 wherein said metal comprises copper.

6. A method of claim 5 wherein said electroless plating catalyst comprises a noble metal.

7. A method of claim 6 wherein said noble metal comprises palladium.

8. A method of claims 2 or 7 wherein said amorphous poly(phenylene sulfide) substrate is selectively crystallized by selectively heating a region of said substrate to a temperature of from about 95° C. to about 150°.

9. A method of claim 8 wherein said selective heating is done by directing heat from a heating source through a mask to said substrate.

10. A method of claim 8 wherein said selective heating is done by selectively heating a region of said substrate with laser light.

11. A method of selectively plating copper onto an amorphous poly(phenylene sulfide) film comprising:
    a. selectively heating a region of said amorphous poly(phenylene sulfide) film to a temperature of from about 95° C. to about 150° C. to crystallize poly(phenylene sulfide) in said region;
    b. acid-etching the surface of said film to convert it from a hydrophobic surface to a hydrophillic surface;
    c. immersing said film in a solution containing palladium catalyst for the electroless plating of copper;
    d. Immersing said film in a solution containing a nitrosyl salt having an anion selected from the group consisting of $PF_6^-$, $AsF_6^-$, and $SbF_6^-$ to thereby selectively dope the amorphous region of said film and inhibit the palladium catalyst in said amorphous region; and
    e. immersing said film into an electroless plating solution containing copper ions and a reducing agent whereby copper is selectively plated onto the crystalline region of said film.

12. A method of claim 11 wherein copper selectively plating on said film is thickened by electroplating additional copper onto said selectively electrolessly plated copper.

13. A method of claim 12 wherein said film is immersed in an inhibited electroless plating solution of copper ions prior to electroplating additional copper thereon.

14. A method of claim 13 wherein said acid-etching is done with a solution of concentratated sulfuric acid containing $Na_2Cr_2O_7 \cdot 2H_2O$.

* * * * *